(12) United States Patent
Yeap et al.

(10) Patent No.: US 6,846,716 B2
(45) Date of Patent: Jan. 25, 2005

(54) INTEGRATED CIRCUIT DEVICE AND METHOD THEREFOR

(75) Inventors: Geoffrey C-F Yeap, Austin, TX (US); Srinivas Jallepalli, Austin, TX (US); Yongjoo Jeon, Austin, TX (US); James David Burnett, Austin, TX (US); Rana P. Singh, Austin, TX (US); Paul A. Grudowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/737,116

(22) Filed: Dec. 16, 2003

(65) Prior Publication Data

US 2004/0124450 A1 Jul. 1, 2004

Related U.S. Application Data

(62) Division of application No. 10/101,298, filed on Mar. 19, 2002, now Pat. No. 6,753,242.

(51) Int. Cl.[7] .............................................. H01L 21/331
(52) U.S. Cl. ...................................... 438/367; 438/366
(58) Field of Search ................................ 438/595, 696, 438/230, 778–785, 366, 367, 368, 369, 257

(56) References Cited

U.S. PATENT DOCUMENTS

| | | | | |
|---|---|---|---|---|
| 5,902,125 A | * | 5/1999 | Wu | ............................. 438/300 |
| 5,960,270 A | | 9/1999 | Misra | |
| 5,972,762 A | | 10/1999 | Wu | |
| 6,066,567 A | | 5/2000 | En | |
| 6,087,271 A | * | 7/2000 | En et al. | ...................... 438/745 |
| 6,156,126 A | | 12/2000 | Chen | |
| 6,245,682 B1 | | 6/2001 | Fu | |
| 6,271,133 B1 | * | 8/2001 | Lim et al. | ................... 438/683 |
| 6,368,947 B1 | | 4/2002 | Yu | |
| 6,372,589 B1 | | 4/2002 | Yu | |
| 2003/0011017 A1 | * | 1/2003 | Lee et al. | .................... 257/314 |
| 2003/0032239 A1 | * | 2/2003 | Rabkin et al. | .............. 438/257 |
| 2003/0102503 A1 | * | 6/2003 | Rabkin et al. | .............. 257/315 |

FOREIGN PATENT DOCUMENTS

WO  WO 01/50504 A2  7/2001

* cited by examiner

Primary Examiner—Chandra Chaudhari
Assistant Examiner—William Vesperman
(74) Attorney, Agent, or Firm—James L. Clingan, Jr.; Kim-Marie Vo

(57) ABSTRACT

A semiconductor device has recesses formed in the substrate during removal of the anti-reflective coating (ARC) because these recess locations are exposed during the etching of the ARC. Although the etchant is chosen to be selective between the ARC material and the substrate material, this selectivity is limited so that recesses do occur. A problem associated with the formation of these recesses is that the source/drains have further to diffuse to become overlapped with the gate. The result is that the transistors may have reduced current drive. The problem is avoided by waiting to perform the ARC removal until at least after formation of a sidewall spacer around the gate. The consequent recess formation thus occurs further from the gate, which results in reducing or eliminating the impediment this recess can cause to the source/drain diffusion that desirably extends to overlap with the gate.

5 Claims, 10 Drawing Sheets

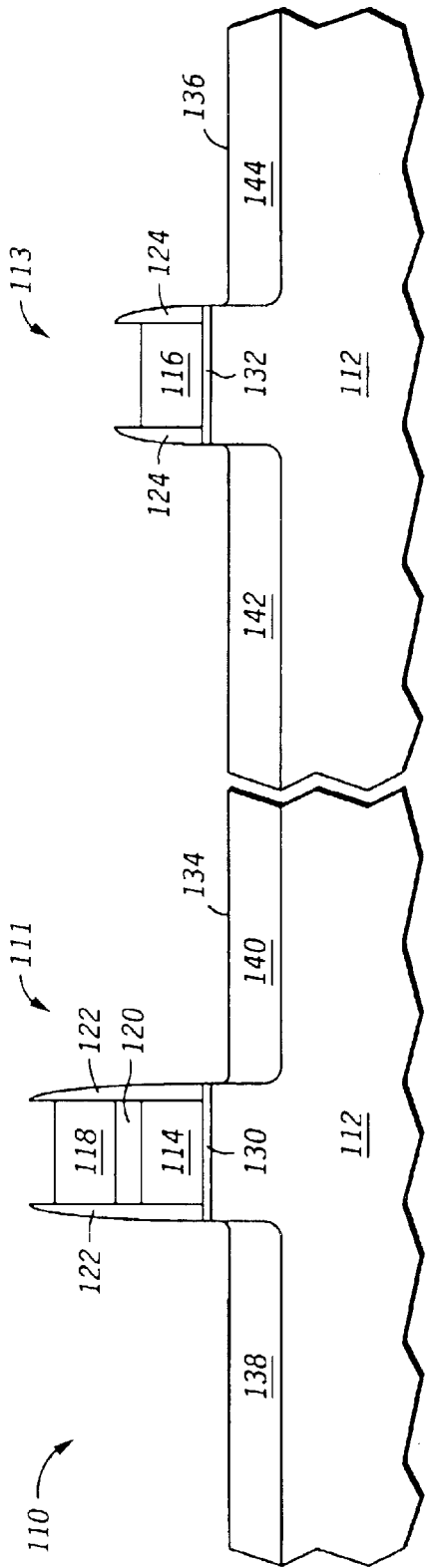
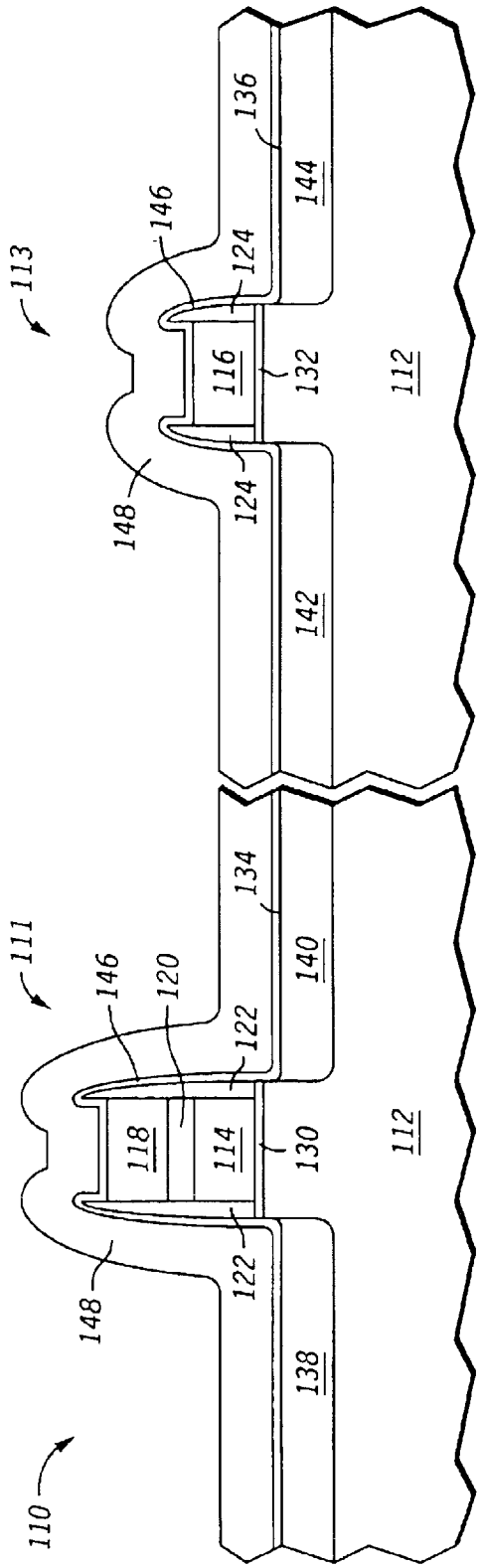
FIG.21
FIG.22

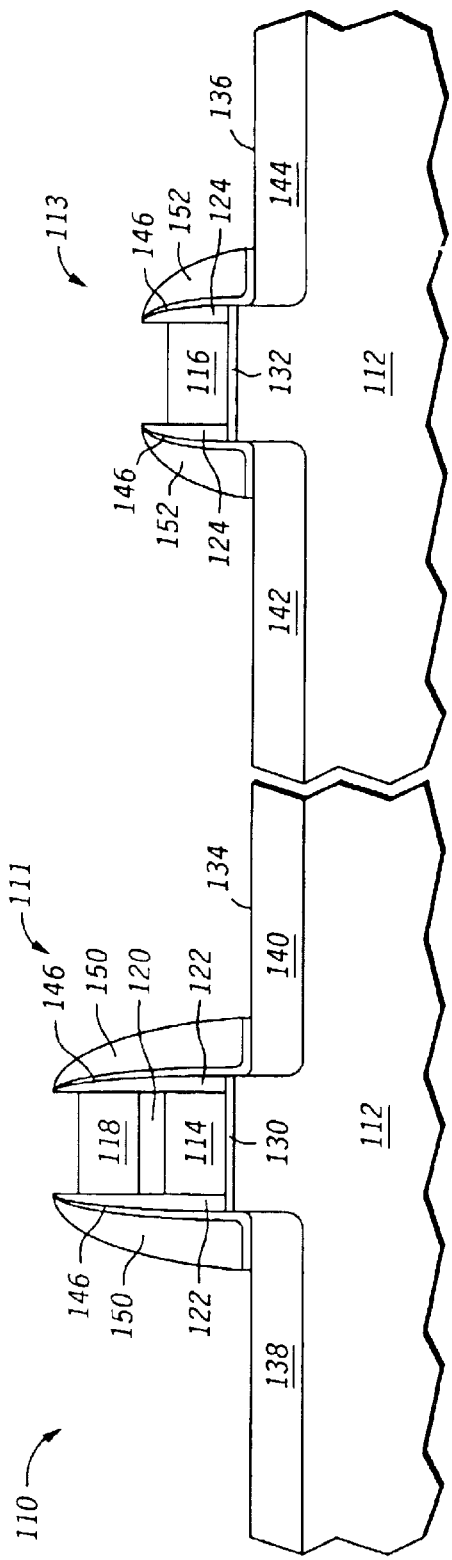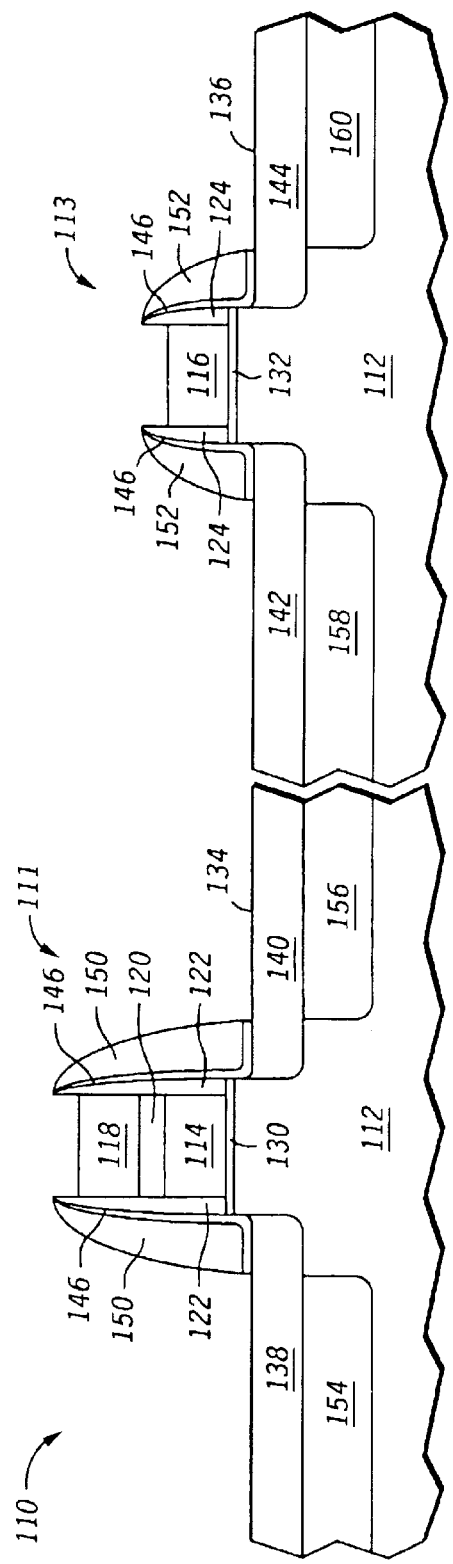

INTEGRATED CIRCUIT DEVICE AND METHOD THEREFOR

This application is a Div. of Ser. No. 10/101,298 Mar. 19, 2002 now U.S. Pat. No. 6,753,242.

FIELD OF THE INVENTION

This invention relates to integrated circuits and more particularly to integrated circuits with a recess in the substrate.

RELATED ART

In the manufacture of integrated circuits one of the problems that has become more significant as dimensions have become smaller is recesses in the substrate that occur under normal processing. The recesses in the substrate occur primarily as a consequence of the substrate being exposed during the etching away of some portion of a layer of material that was over the substrate. An etchant is applied to the substrate for some amount of time during and/or after the layer that is being etched has been removed. One example is that there is a situation in which there is exposed substrate at the onset of an etch of another material in a different location. Another example is that a thin layer over the substrate is etched through during an etch of a material elsewhere so that the substrate becomes exposed part way through the etch of the material elsewhere. Another example is that a layer over the substrate is being etched and after the substrate becomes exposed, the etch continues as an over-etch to ensure that the layer that is desired to be removed is completely removed. The etchant that is chosen desirably does not significantly etch semiconductor substrates, but as a practical matter such etchants are very difficult to work with. Consequently the layers that are desired to be removed are removed by an etchant that does have some etching effect on the semiconductor substrate, typically silicon. Such a process is shown in FIGS. 1–9.

Shown in FIG. 1 is a semiconductor device 10 useful in making an integrated circuit comprising a substrate 12, a polysilicon gate 14, an anti-reflective coating (ARC) 16 of nitride, and a thin oxide 18 which is between gate 14 and substrate 12 as well as extending in areas adjacent to gate 14. In order to remove nitride ARC 16, an etchant, such as a halogen based material such as fluorine and chlorine, is used. These etchants also etch silicon although at not as fast a rate as nitride is etched. The result of removing ARC 16 is a recess surface 22 shown in FIG. 2. Shown in FIG. 3 is device 10 after formation of a sidewall spacer 24. Sidewall spacer 24 is formed of oxide and occurs as a result, as is commonly known, of applying a relatively conformal layer and subsequently etching it with an anisotropic etch. This causes a further recess in substrate 12 aligned with sidewall spacer 24. Shown in FIG. 4 is formation of source/drain region 26 and source/drain 28 using sidewall spacer 24 as a mask. This implant is commonly called the extension implant and has a relatively lower doping concentration than a subsequent heavy source/drain implant.

Shown in FIG. 5 is device 10 after deposition of an oxide liner 30 and a nitride layer 32. Nitride layer 32 is then etched back as is liner 30 resulting in sidewall spacer 34 and liner portion 38. During this processing, source/drain regions 26 and 28 diffuse, expanding the area of source/drain regions 26 and 28. Shown in FIG. 7 is device 10 after a heavy implant to form heavily-doped regions 40 and 42 using sidewall spacer 34 as a mask. Shown in FIG. 8 is continued expansion of source/drain regions 26 and 28 as well as diffusion of regions 40 and 42 due to standard processing.

Shown in FIG. 9 is device 10 after formation of silicide regions 48 and 50 which extend under regions 40 and 42. This also shows a completed diffusion of regions 49 and 51, which are the remaining portions of regions 26 and 28. These regions may not extend all the way to gate oxide 20. With the regions 49 and 51 not fully extending to be in contact with gate oxide 20, there is some additional space between gate 44 and the channel formed between regions 49 and 51 so that current passing between regions 49 and 51 is less than it would be if they had diffused in closer proximity to gate 20. This is a disadvantage and is a direct result of the additional distance the diffusion must travel due to the recess of substrate 12 adjacent to gate 44. Salicide region 46 is also formed on top of gate 14 and consumes a significant amount of gate 14 to leave a gate that is a combination of a region 44 of polysilicon and a region 46 of silicide.

Thus, there is a need to reduce the adverse effects of a recess that occurs in the substrate during normal processing. This problem continues to get worse as dimensions decrease and voltages decrease. The ability to completely invert the channel and provide optimum current between source and drain is compromised if the source and drain do not have the proper overlap with the overlying gate.

BRIEF DESCRIPTION OF THE DRAWINGS

FIGS. 19–25 are sequential cross-sections of a semiconductor device made according to another embodiment of the invention.

DESCRIPTION OF THE INVENTION

A problem with recess in the substrate is overcome by waiting until later in the process to remove the nitride anti-reflective coating (ARC) so that the recess that occurs has much less impact with regard to the source and drain moving in to close proximity to the gate dielectric and overlapping with the gate. One way this is achieved is by waiting until the sidewall spacer stack that is utilized for masking the heavy source/drain implant is in place before removing the nitride ARC. In an alternative, the nitride ARC is removed after formation of the sidewall spacer that is used for the source/drain extension implant and in such case the nitride ARC is removed with a wet etch.

Figure 1:
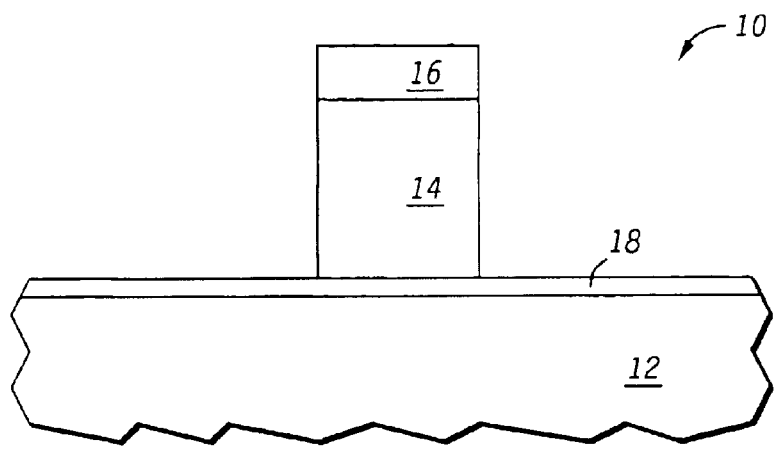
FIGS. 1–9 show sequential cross-sections of a semiconductor device according to the prior art.
Figure 2:
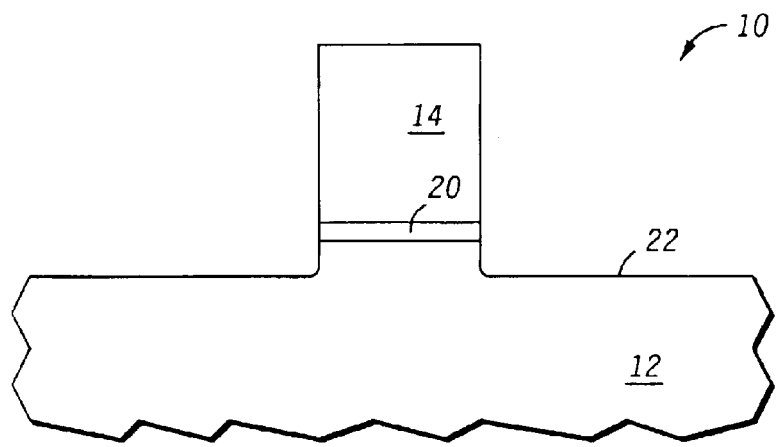
Figure 3:
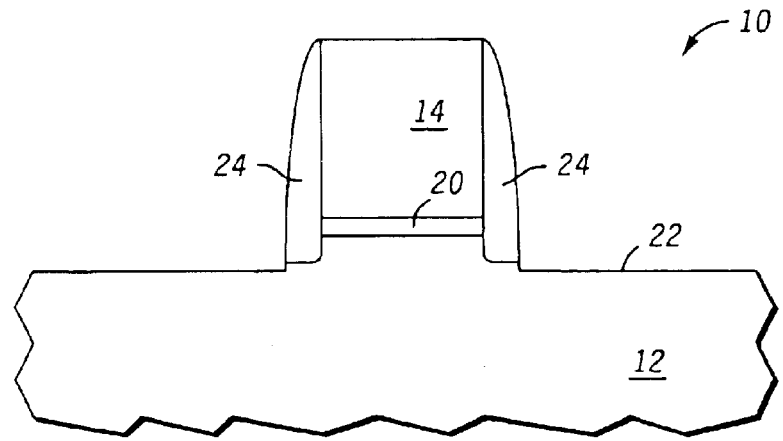
Figure 4:
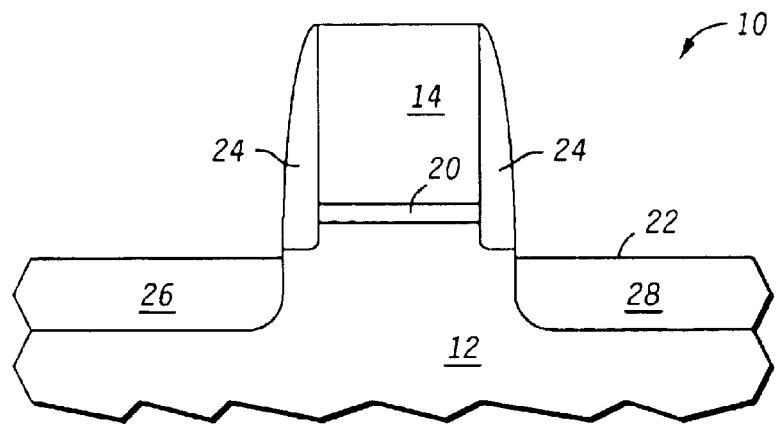
Figure 5:
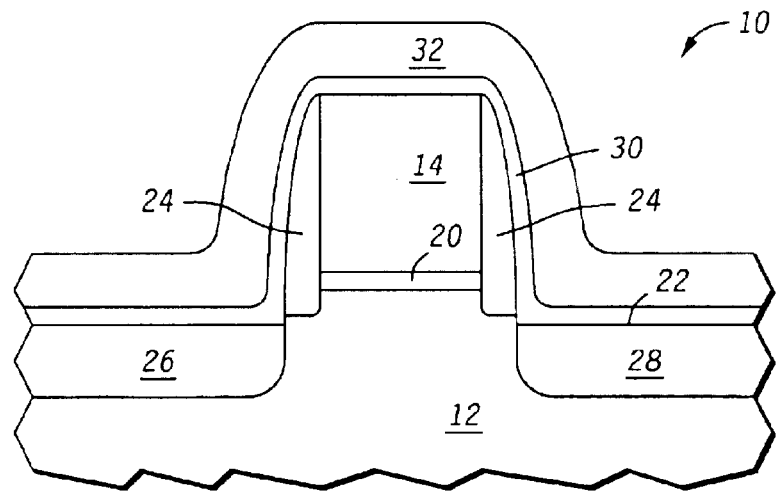
Figure 6:
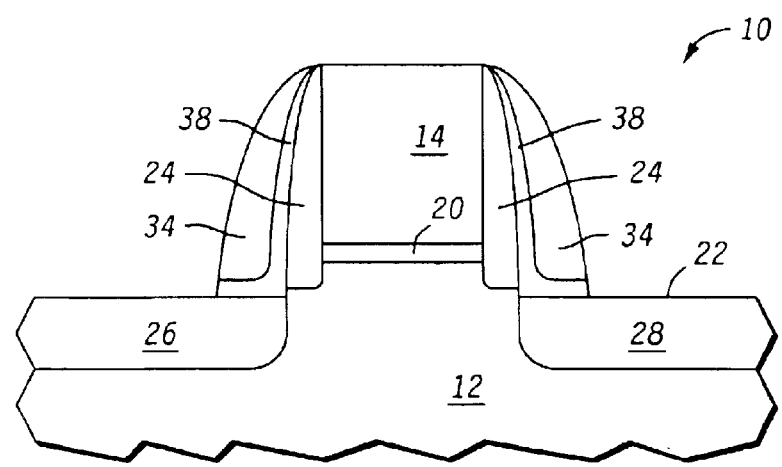
Figure 7:
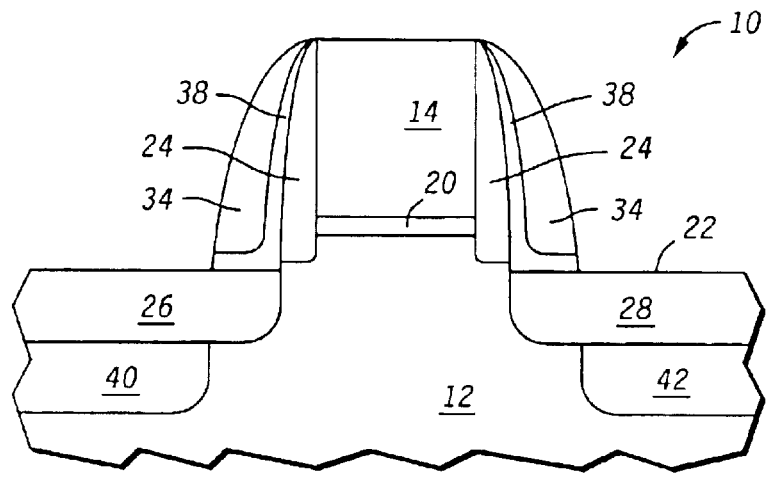
Figure 8:
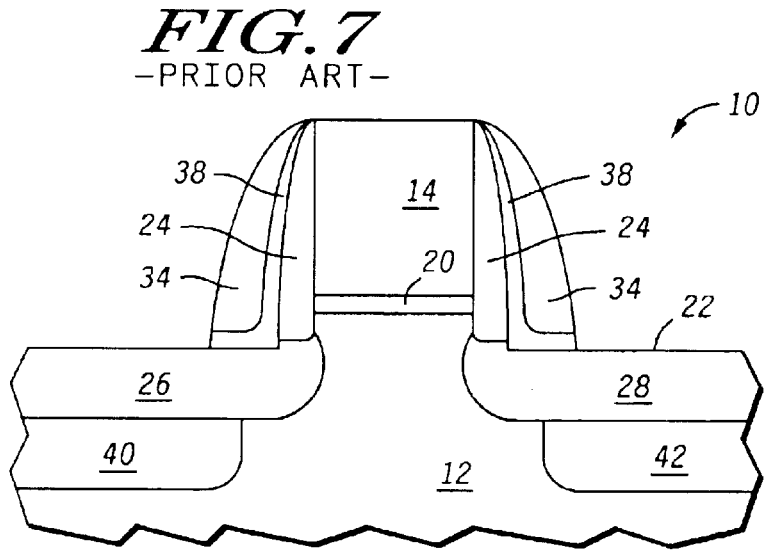
Figure 9:
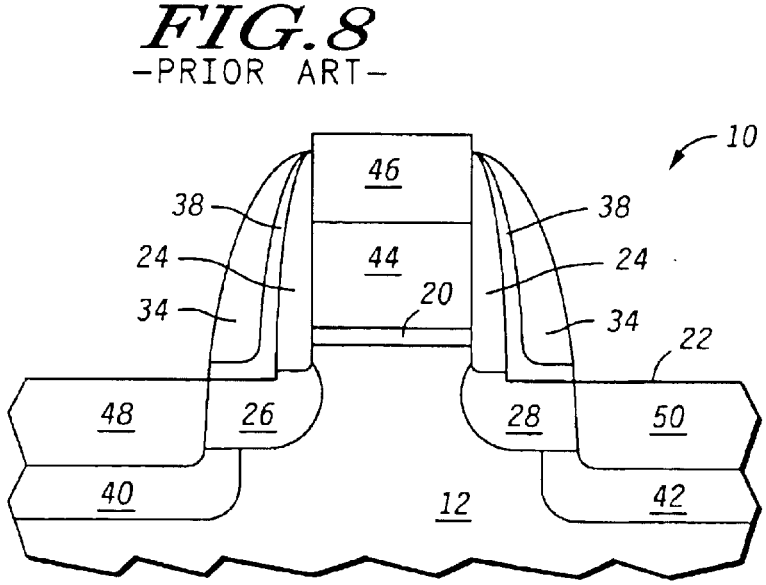
Figure 10:
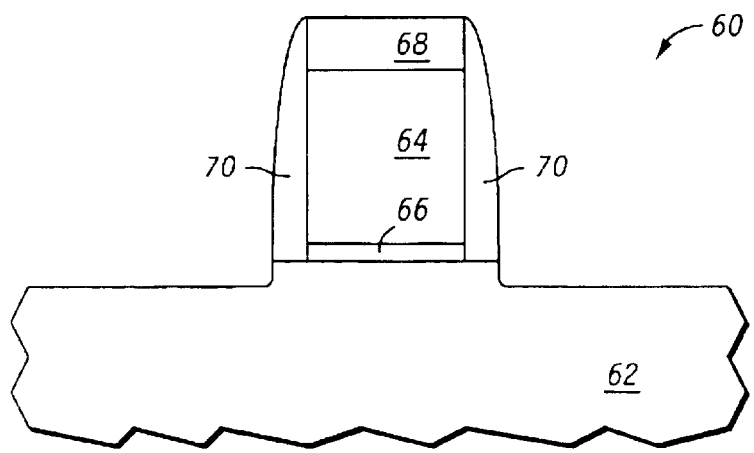
FIGS. 10–18 are sequential cross-sections of a semiconductor device made according to one embodiment of the invention.
Figure 11:
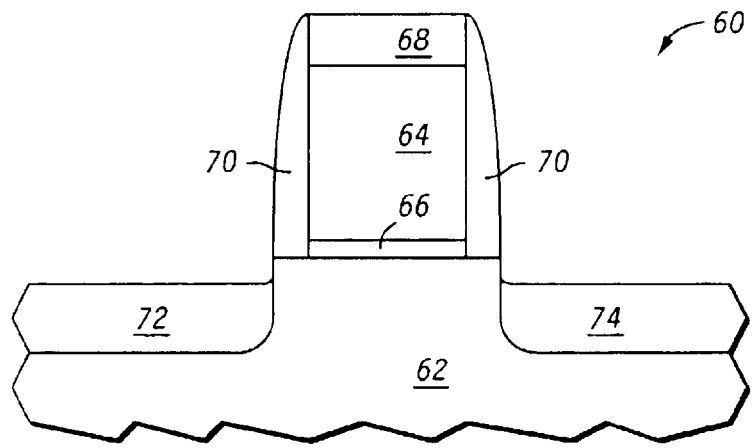

Shown in FIG. 10 is a device 60 after formation of a sidewall spacer 70 as an alternative to the structure shown in FIG. 2. The structure of FIG. 10 follows the device structure shown in FIG. 1. Device 60 comprises a substrate 62, a gate 64, which may be made of polysilicon and is a type of patterned conductive layer, a gate oxide 66, an ARC 16, which may be nitride, and a sidewall spacer 70. Preferable material for substrate 62 is silicon and for sidewall spacer 70 is oxide. ARC 16 could be of some other effective anti-reflective material than nitride as well. Gate 64 could be materials other than polysilicon also. Sidewall spacer 70 results from an oxide layer that is relatively conformal being anisotropically etched. As a consequence of this anisotropic etch will be a recess 71 of substrate 62. This is a consequence of the necessary over-etch to ensure that all of the layer that is being used to form the sidewall spacer is removed except where the sidewall spacer is to be formed. Since the only exposure of the substrate is during an over-etch time, the recess is relatively small. Shown in FIG.

11 is device 60 after a source/drain extension implant forming source/drain region 72 and source/drain region 74 adjacent to sidewall spacer 70 which surrounds gate 64.

Figure 12:
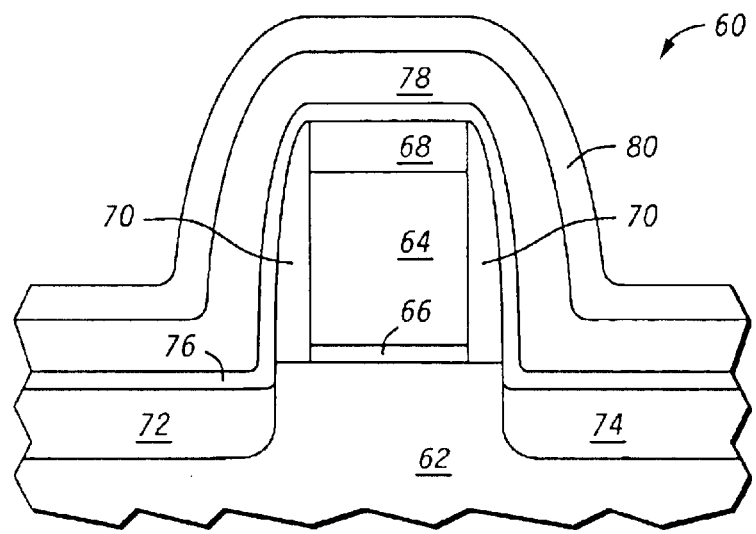
Figure 13:
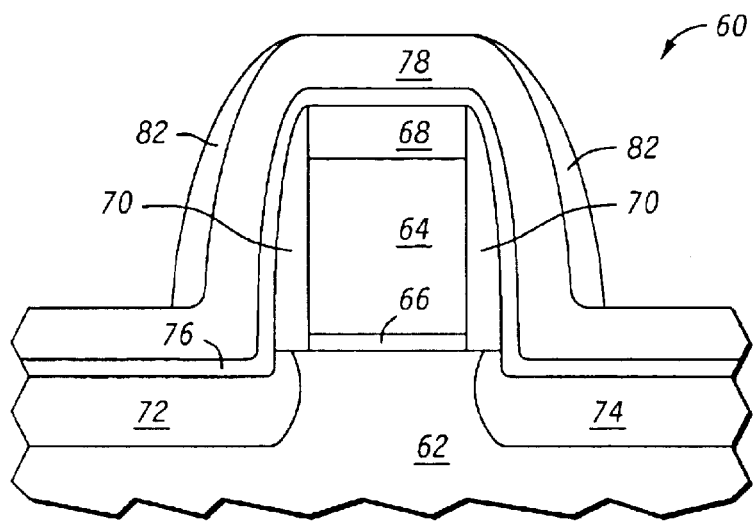
Figure 14:
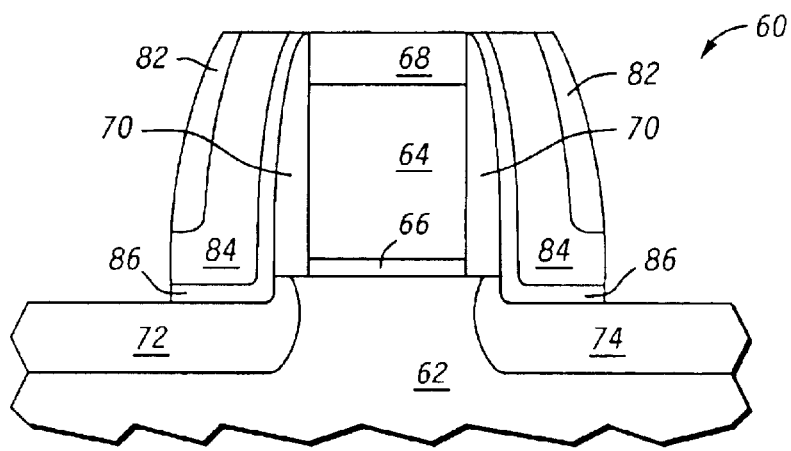
Figure 15:
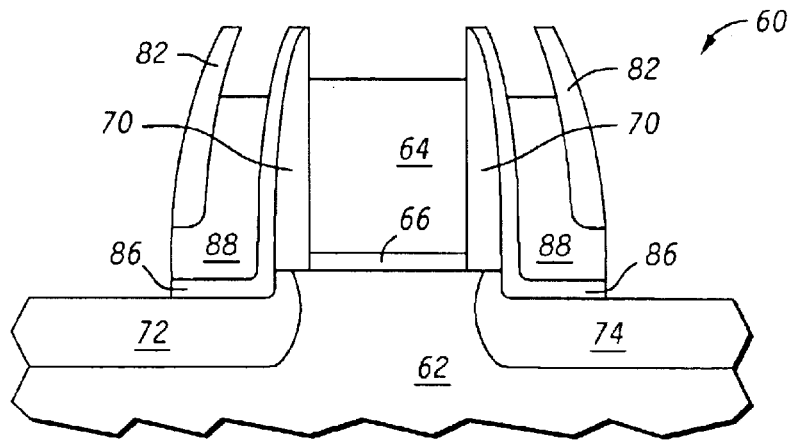

Shown in Shown in FIG. 12 is device 60 after formation of liner 76, a layer 78, and a layer 80. Layer 76, 78 and 80 are all typically dielectric materials. Layer 76 is preferably oxide, layer 78 is preferably nitride, and layer 80 is preferably oxide, but instead of a typical dielectric may be amorphous silicon. Shown in FIG. 13 is sidewall spacer 82 formed from layer 80 using an anisotropic etch. This exposes layer 78 of nitride in areas adjacent to sidewall spacer 82 including an area over gate 64 and ARC 68 as well as a portion of layer 76 which functions as a liner. Shown in FIG. 14 is device 60 after a nitride etch has been performed so that uncovered portions of layer 78 are removed to leave nitride portions 84 around gate 64. This also has the effect of removing the portion of layer 76 above ARC 68 to leave a portion 86 of layer 76. During this processing regions 72 and 74 diffuse toward each other and toward being under gate 64. With the relatively small amount of recess of substrate 62, the diffusion process is effective in overcoming that small amount of recess. The removal of nitride continues until ARC 68 has been removed which also causes a reduction in the height of sidewall spacer 84 to leave sidewall spacer 88. Sidewall spacer 88 is slightly lower than polysilicon 64 due to over-etching which is necessary to be certain that all of ARC 68 has been removed. A relatively large recess in substrate 62 aligned with sidewall spacer 82 occurs primarily during the etch of ARC 68. This etch is preferably a dry etch because of its superior defectivity characteristics over that of a wet etch. The dry etch will result in a greater recess in substrate 62 than if a wet etch had been used. In this case, however, the relative difference is not material because the recess is significantly removed from the area where it would have a negative impact on the ability of source/drain regions 72 and 74 to become overlapped with gate 64.

Figure 16:
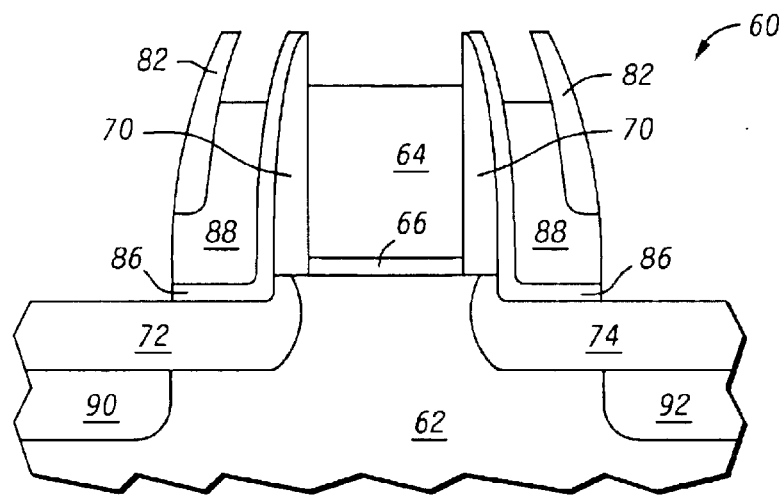
Figure 17:
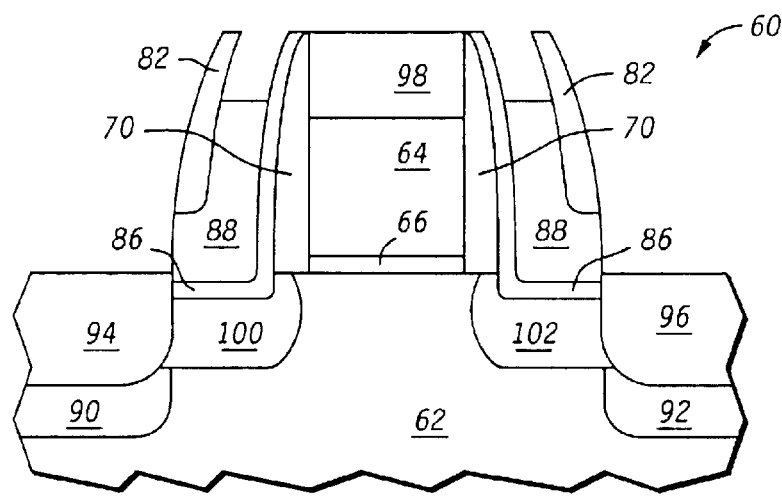
Figure 18:
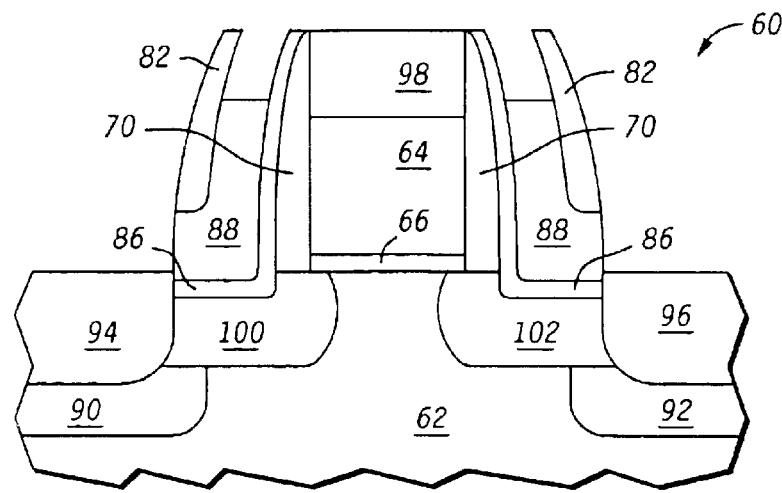

Shown in FIG. 16 is device 60 after a heavy source/drain implant resulting in heavily doped source/drain regions 90 and 92 aligned to sidewall spacer 82 which acts as an implant mask. If sidewall spacer 82 is chosen to be amorphous silicon, it should be removed after this implant. Shown in FIG. 17 is device structure 60 after a silicide step forms silicide regions 94 and 96 that is also aligned to sidewall spacer 82. If sidewall spacer 82 was chosen to be amorphous silicon, it should be removed before this step of forming silicide. In the depicted example, sidewall spacer 82 is oxide. Shown in FIG. 18 are portions 100 and 102 of source/drain regions 72 and 74, respectively, that have diffused sufficiently to overlap gate 64. The relatively small recess caused during the over-etch in the formation of sidewall spacer 70 is all that needs to be overcome so that source/drain regions 100 and 102 overlap gate 64. The recess caused by the etching away of ARC 16 is not visible in the final device structure shown in FIG. 18. The formation of silicide in the area of the recession removes the evidence that there was even a recess present. Thus it is seen that by moving the location of the relatively large recessed area caused as a result of the removal of the ARC layer by a dry etch further away from the gate area, this relatively large recessed area does not impact the distance that the source/drain must diffuse to obtain the desired overlap.

Figure 19:
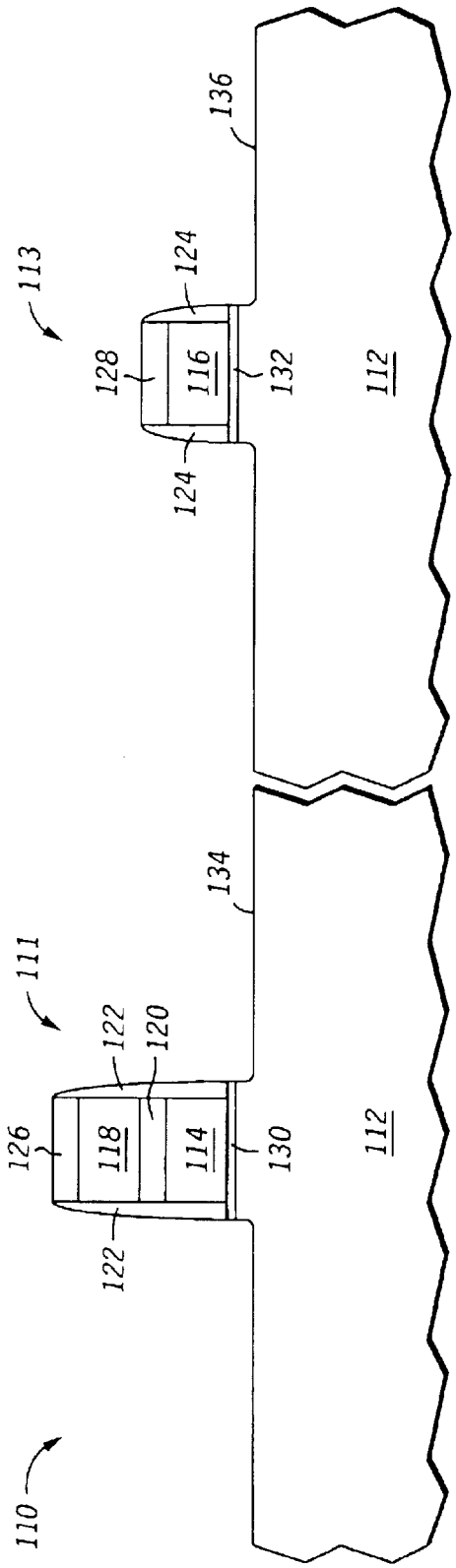
Figure 20:
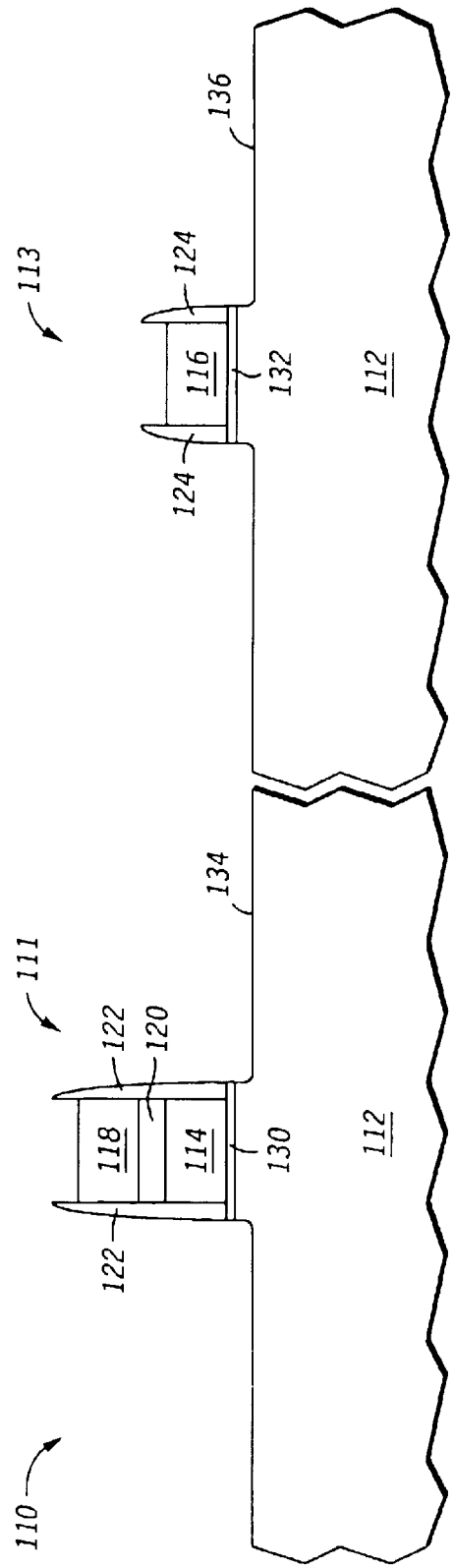

Shown in FIG. 19 is a device structure 110 is shown as a beginning point for another embodiment comprised of a non-volatile memory (NVM) transistor 111 and a regular transistor 113 both of which are formed in a substrate 112. Transistor 111, as shown in FIG. 19, comprises a gate oxide 130, a floating gate 114, an interlayer dielectric 120, and a control gate 118. Regular transistor 113 comprises a gate oxide 132 and a gate 116. Over control gate 118 is an ARC layer 126 and over gate 116 is an ARC layer 128. These are two transistors are formed simultaneously and are shown as transistors that would occur as a result of formation of sidewall spacers 122 and 124 and analogous to FIG. 10. Thus there is a recess in the surface of substrate 112 shown as 134 and 136 in FIG. 19. This recess is caused by the over-etch in the formation of sidewall spacer 122. Shown in FIG. 20 is device structure 110 after ARC layers 126 and 128 have been removed using a wet etch. By using a wet etch the recess shown in 134 and 136 in FIG. 120 is significantly less than it would be if a dry etch were used. A typical wet etch chemistry is phosphoric acid. A typical dry etch for nitride is CF4+HBO. The wet etch is effective in this situation because sidewall spacer 122 protects interlayer dielectric 120. A wet etch without sidewall spacer 122 protecting interlayer dielectric 120 would degrade dielectric layer 120 and cause a problem between the storage element 114 and the control gate 118. It is important that there not be leakage between storage element 114, which in this depicted case is a floating gate, and control gate 118. With the protection of sidewall spacer 122, the wet etch will not harm interlayer dielectric 120. This also shows the resulting transistor 113 with ARC 128 removed.

Shown in FIG. 21 is device structure 110 after an extension implant using sidewall spacer 122 as a mask and sidewall spacer 124 as a mask. The resulting source/drain extension regions 138, 140, 142, and 144 are formed. Shown in FIG. 22 is device structure 110 after deposition of a liner 146 and a nitride layer 148. Nitride layer 148 is then anisotropically etched to form sidewall spacer 150 and sidewall spacer 152. Liner 146 is substantially, if not completely, removed in those areas where it is exposed as a consequence of the removal of nitride layer 148 in the forming of sidewall spacers 150 and 152. Shown in FIG. 24 is device structure 110 after a heavy implant to form heavily doped source/drain regions 154, 156, 158, and 160 using sidewall spacers 150 and 152 as a mask.

Figure 25:
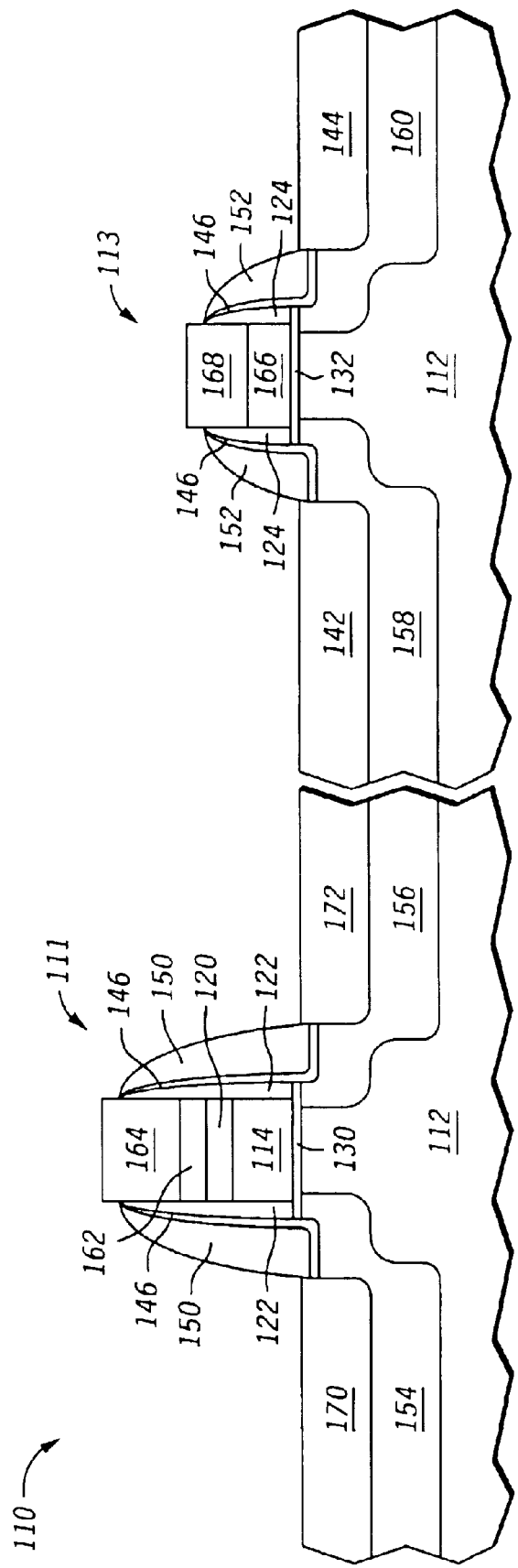

Shown in FIG. 25 is device structure 110 after silicide formation to form silicide regions 170, 172, 174, and 176. Thus the source/drain regions 142 and 144 have, to a large extent, been consumed by silicide regions 170, 172, 174, and 176. Similarly, gate regions 114 and 116 have been somewhat consumed by silicide regions 164 and 168 respectively. This leaves a polysilicon portion 167 for transistor 111 and a polysilicon portion 166 for transistor 113. Source/drain portions 178, 180, 182, and 184 expand and diffuse sufficiently to overlap gate regions 167 and 166 although there is a recess to overcome caused by removal of the ARC. Such ARC removal is by wet etch so that the amount of the recess is significantly less then that of a dry etch. Although the dry etch is preferred, in the case of a non-volatile memory the significance of having sufficient overlap is greater than for a regular transistor. Thus it is more important that the overlap between the floating gate, the area that has charge storage in it, to have good overlap in the source/drain area. Also, by having the ARC removed after formation of sidewall spacer 122, the location of the recess does not have as severe of an impact as for the case depicted in FIGS. 1–9 in which the ARC removal occurs prior to formation of such sidewall spacer. In the case of FIGS. 1–9, the sidewall spacer 24 is formed after removal of the ARC layer.

What is claimed is:

1. A method of forming an integrated circuit device comprising:

providing a semiconductor substrate having a first portion and a second portion;

forming a gate stack comprising:
  a gate dielectric formed over the first portion of the semiconductor substrate; and
  a gate electrode formed over the gate dielectric;

forming a first patterned anti-reflective coating (ARC) over the gate stack;

forming a non-volatile memory stack comprising:
  a charge storage layer formed over the second portion of the semiconductor substrate; and
  a first dielectric layer formed over the charge storage layer;

forming a second patterned ARC over the non-volatile memory stack;

forming a second dielectric layer over the gate stack and the non-volatile memory stack;

removing portions of the second dielectric layer to form first spacers adjacent the gate stack and the non-volatile memory stack;

removing the first patterned ARC and the second patterned ARC after removing portions of the second dielectric layer;

forming a first channel under the gate stack; and forming a second channel under the non-volatile memory stack.

2. The method of claim 1, further comprising:
  forming a third dielectric layer over first spacers;
  forming a fourth dielectric layer over the third dielectric layer;
  removing portions of the third dielectric layer to form second spacers adjacent the first spacers; and
  removing portions of the fourth dielectric layer to form third spacers adjacent the second spacers.

3. The method of claim 2, wherein removing the first patterned ARC and the second patterned ARC is before forming a third dielectric layer and forming a fourth dielectric layer.

4. The method of claim 3, wherein the second dielectric layer is densified prior to forming first spacers and removing the first patterned ARC and the second patterned ARC is a wet process.

5. The method of claim 4, wherein the second dielectric layer is an oxide, the third dielectric layer is an oxide, and the fourth dielectric layer is a nitride.

* * * * *